United States Patent
Alpert et al.

(10) Patent No.: US 9,785,738 B1
(45) Date of Patent: Oct. 10, 2017

(54) SYSTEM AND METHOD FOR EVALUATING SPANNING TREES

(71) Applicant: Cadence Design Systems, Inc., San Jose, CA (US)

(72) Inventors: Charles Jay Alpert, Cedar Park, TX (US); Zhuo Li, Cedar Park, TX (US); Wing Kai Chow, Kowloon (HK); Wen-Hao Liu, Austin, TX (US); Derong Liu, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/972,809

(22) Filed: Dec. 17, 2015

(51) Int. Cl.
G06F 17/50 (2006.01)

(52) U.S. Cl.
CPC ...... *G06F 17/5081* (2013.01); *G06F 17/5077* (2013.01)

(58) Field of Classification Search
USPC ....................................................... 716/126
See application file for complete search history.

(56) References Cited

U.S. PATENT DOCUMENTS

2007/0271543 A1* 11/2007 Alpert ................... G06F 17/509
716/114

OTHER PUBLICATIONS

Khuller et al., "Balancing Minimum Spanning and Shortest Path Trees," Computer Science Department, University of Maryland, Chapter 27, pp. 243-250; downloaded on Nov. 15, 2015.
Cong et al., "Provably Good Performance-Driven Global Routing," IEEE Transactions on Computer-Aided Design, vol. 11, No. 6, Jun. 1992, pp. 739-752.
Boese et al., "High-Performance Routing Trees With Identified Critical Sinks," Computer Science Department, University of California at Los Angeles, 30th ACM/IEEE Design Automation Conference, 1993, pp. 182-187.
Alpert et al., "Prim-Dijkstra Tradeoffs for Improved Performance-Driven Routing Tree Designs," IEEE Transactions on Computer-Aided Design of Integrated Circuits and Systems, vol. 14, No. 7, Jul. 1995, pp. 890-896.
Alpert et al., "Timing-Driving Steiner Trees are (Practically) Free," IBM Austin Research Lab, Austin, TX 78758, DAC 2006, Jul. 24-28, 2006, pp. 389-392.

* cited by examiner

*Primary Examiner* — Eric Lee
(74) *Attorney, Agent, or Firm* — Mark H. Whittenberger, Esq.; Holland & Knight LLP

(57) ABSTRACT

The present disclosure relates to a system and method for evaluating spanning trees. Embodiments may include receiving, using at least one processor, a spanning tree including one or more sinks coupled by one or more edges. Embodiments may further include receiving a user-selected floating parameter. Embodiments may also include interchanging the one or more edges of the spanning tree based upon, at least in part, the user-selected floating parameter.

15 Claims, 12 Drawing Sheets

300

SYSTEM AND METHOD FOR EVALUATING SPANNING TREES

FIELD OF THE INVENTION

The present disclosure relates to electronic design automation (EDA), and more specifically, to a system and method for evaluating spanning trees.

DISCUSSION OF THE RELATED ART

EDA utilizes software tools that may be used in the design and analysis of numerous electronic systems such as printed circuit boards (PCBs) and integrated circuits (ICs). Spanning trees may be used in determining a wire routing for PCBs and ICs. A Prim-Dijkstra (PD) algorithm can generate a spanning tree. The time complexity of the PD algorithm is (e log e), where e is the number of edges in a given routing graph associated with the spanning tree. However, the PD algorithm does not generate an optimal wirelength/detour tradeoff. It may be of interest to seek a post-processing edge swapping process to obtain better spanning trees.

SUMMARY OF INVENTION

In one or more embodiments of the present disclosure, a computer-implemented method is provided. The method may include receiving, using at least one processor, a spanning tree including one or more sinks coupled by one or more edges. The method may further include receiving a user-selected floating parameter. The method may also include interchanging the one or more edges of the spanning tree based upon, at least in part, the user-selected floating parameter.

One or more of the following features may be included. In some embodiments, the interchanging the one or more edges may be further based upon, at least in part, at least one of: one or more wirelengths of the spanning tree, one or more detour costs associated with the one or more sinks of the spanning tree, and a number of downstream sinks associated with each sink of the one or more sinks of the spanning tree. In some embodiments, the spanning tree is associated with an integrated circuit design. In some embodiments, interchanging the one or more edges may include changing a direction of the one or more edges. The method may include determining the number of downstream sinks associated with each sink of the one or more sinks of the spanning tree. The method may also include updating each sink of the one or more sinks with a common detour cost change after interchanging one or more edges. In some embodiments, interchanging the one or more edges may include selecting an edge of the one or more edges that is shared by a plurality of source-to-sink paths.

In some embodiments, a computer-readable storage medium is provided. The computer-readable storage medium may have stored thereon instructions that when executed by a machine result in one or more operations. Operations may include receiving a spanning tree including one or more sinks coupled by one or more edges. Operations may further include receiving a user-selected floating parameter. Operations may also include interchanging the one or more edges of the spanning tree based upon, at least in part, the user-selected floating parameter.

One or more of the following features may be included. In some embodiments, interchanging the one or more edges may be further based upon, at least in part, at least one of: one or more wirelengths of the spanning tree, one or more detour costs associated with the one or more sinks of the spanning tree, and a number of downstream sinks associated with each sink of the one or more sinks of the spanning tree. In some embodiments, the spanning tree is associated with an integrated circuit design. In some embodiments, wherein interchanging the one or more edges may include removing a tree edge and adding a non-tree edge. In some embodiments, interchanging the one or more edges may include changing a direction of the one or more edges. Operations may include determining the number of downstream sinks associated with each sink of the one or more sinks of the spanning tree. Operations may also include updating each sink of the one or more sinks with a common detour cost change after interchanging one or more edges. In some embodiments, interchanging the one or more edges may include selecting an edge of the one or more edges that is shared by a plurality of source-to-sink paths.

In one or more embodiments of the present disclosure, a system may include a computing device having at least one processor configured to receive a spanning tree associated with an integrated circuit design including one or more sinks coupled by one or more edges. The at least one processor may be further configured to receive a user-selected floating parameter. The at least one processor may be further configured to interchange the one or more edges of the spanning tree based upon, at least in part, the user-selected floating parameter.

One or more of the following features may be included. In some embodiments, interchanging the one or more edges may be further based upon, at least in part, at least one of: one or more wirelengths of the spanning tree, one or more detour costs associated with the one or more sinks of the spanning tree, and a number of downstream sinks associated with each sink of the one or more sinks of the spanning tree. In some embodiments, interchanging the one or more edges may include removing a tree edge and adding a non-tree edge. In some embodiments, interchanging the one or more edges may include changing a direction of the one or more edges.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

Figure 1:
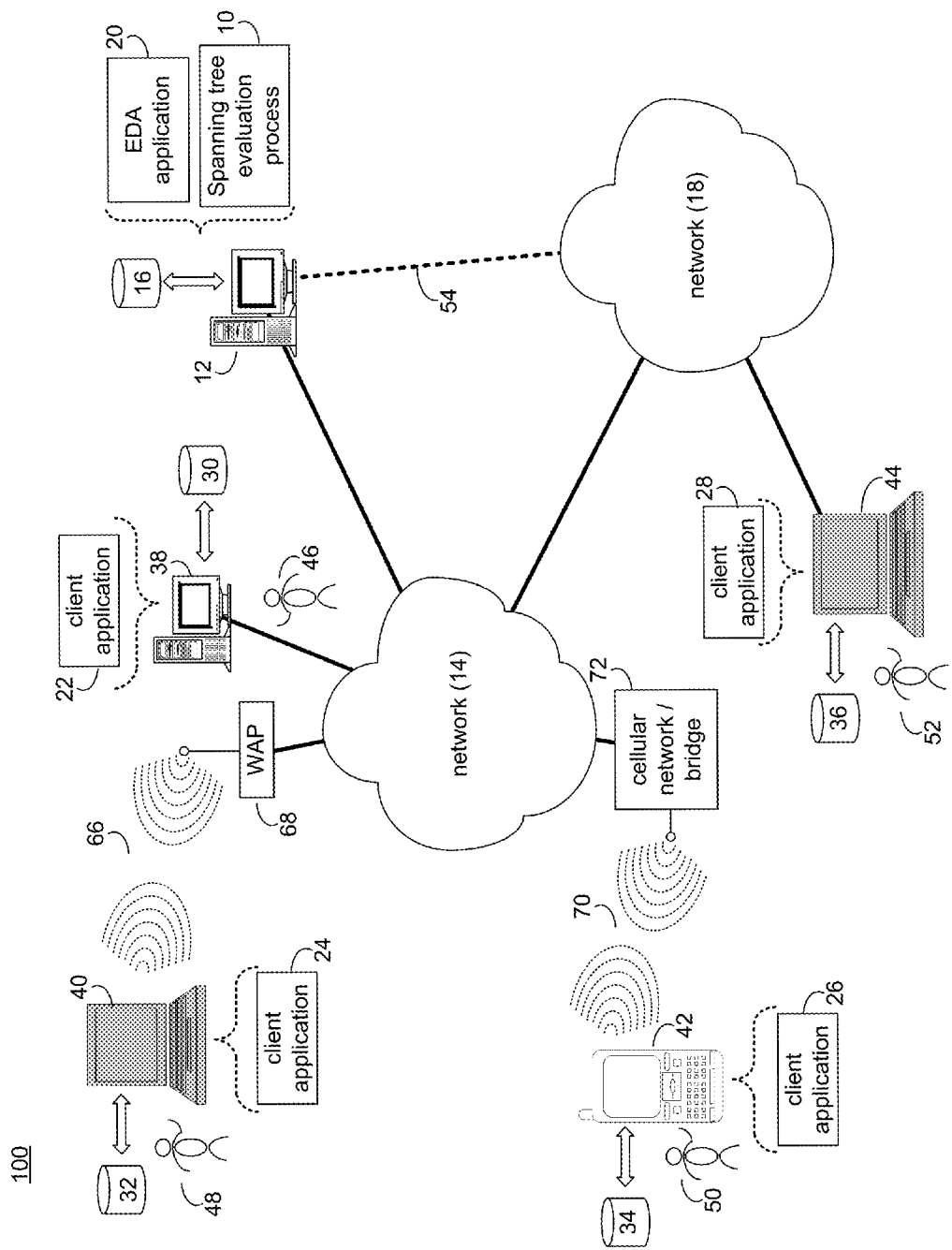
FIG. 1 is a system diagram depicting aspects of the spanning tree evaluation process in accordance with an embodiment of the present disclosure.

Referring to FIG. 1, there is shown spanning tree evaluation process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the spanning tree evaluation process may reside on and be executed, in whole or in part, by a client electronic device, such as a personal computer, notebook computer, personal digital assistant, or the like.

The instruction sets and subroutines of spanning tree evaluation process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28). EDA application 20 may be referred to herein as a design tool.

Spanning tree evaluation process 10 may be a stand-alone application, or may be an applet/application/script that may interact with and/or be executed within EDA application 20. In addition/as an alternative to being a server-side process, the spanning tree evaluation process may be a client-side process (not shown) that may reside on a client electronic device (described below) and may interact with an EDA client application (e.g., one or more of EDA client applications 22, 24, 26, 28). Further, the spanning tree evaluation process may be a hybrid server-side/client-side process that may interact with EDA application 20 and an EDA client application (e.g., one or more of client applications 22, 24, 26, 28). As such, the spanning tree evaluation process may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize spanning tree evaluation process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both).

Figure 2:
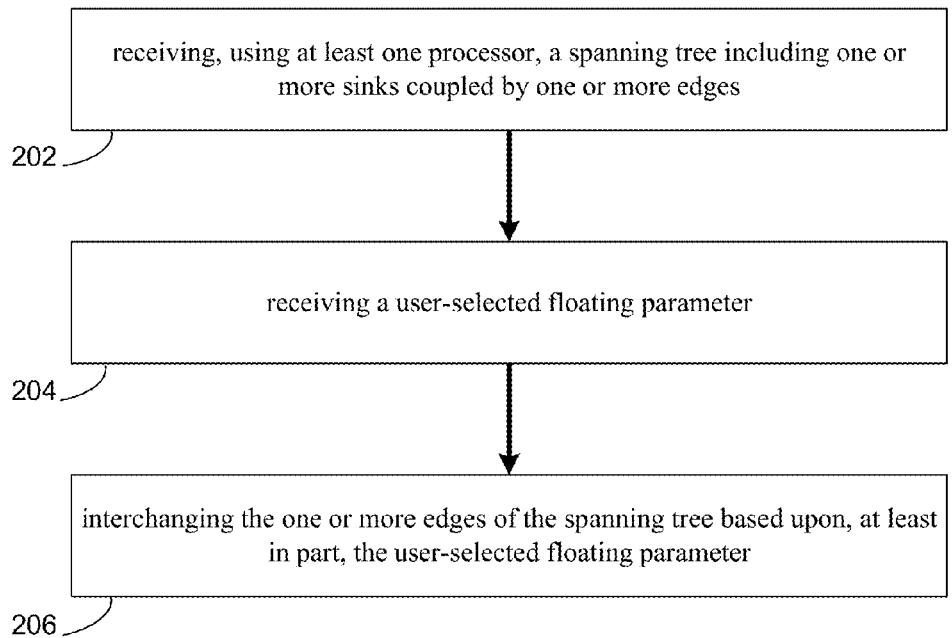
FIG. 2 is a flowchart depicting operations consistent with the spanning tree evaluation process of the present disclosure.

Referring to FIGS. 2-12, various embodiments consistent with spanning tree evaluation process 10 are provided. As shown in FIG. 2, embodiments of spanning tree evaluation process 10 may include receiving (202), using at least one processor, a routing including one or more sinks coupled by one or more edges. Embodiments may further include receiving (204) a user-selected floating parameter. Embodiments may also include interchanging (206) the one or more edges of the spanning tree based upon, at least in part, the user-selected floating parameter.

Figure 3A:
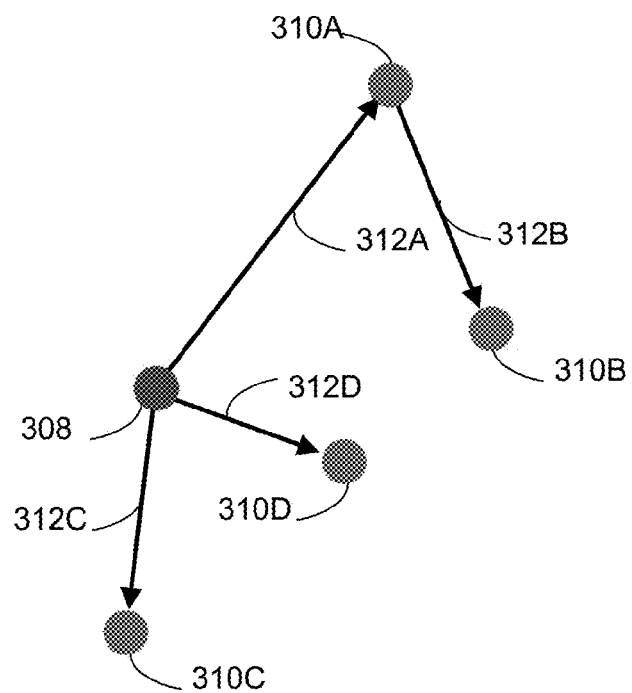
FIG. 3A is a schematic depicting a spanning tree in accordance with an embodiment of the present disclosure.
Figure 3B:
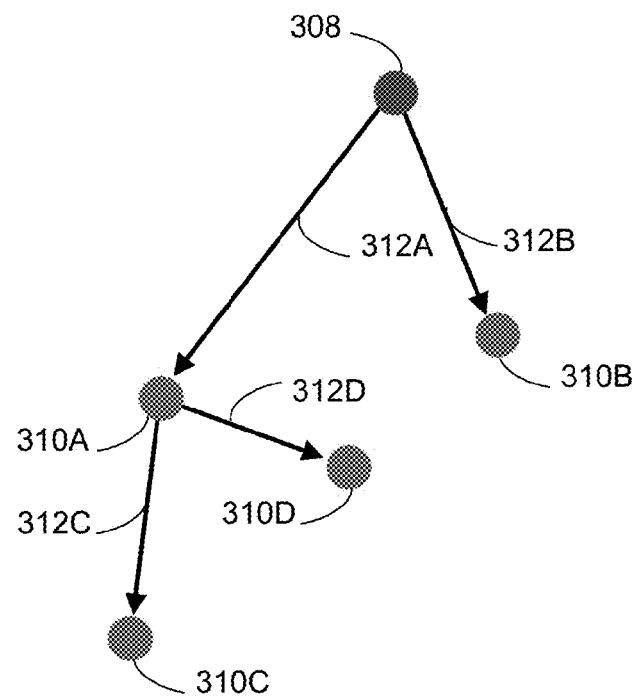
FIG. 3B is a schematic depicting a spanning tree in accordance with an embodiment of the present disclosure.

In some embodiments and as shown in FIGS. 3A and 3B, spanning tree evaluation process 10 may include receiving a spanning tree including one or more sinks coupled by one or more edges. A "spanning tree" as used herein may include, but is not limited to, one or more possible interconnections between a plurality of nodes in a network and/or a signal net. While a network may include the interconnection and/or communication of a plurality electronic devices (e.g., wired connections, wireless connections, etc.), this is a non-limiting example within the scope of the present disclosure. A network may also include the relationship(s) between various mathematical structures and/or symbols. Examples of networks that may be represented by a spanning tree include, but are not limited to, communication networks, power networks (e.g., electrical transmission), utility networks (e.g., liquid piping), and other networks of information and/or resources that may be represented by a spanning tree.

In one example, a spanning tree may be associated with an integrated circuit design. The spanning tree may describe how a group of terminals connects both directly and/or indirectly to a source pin in the integrated circuit design. In some embodiments, the spanning tree may be associated with a VLSI circuit routing design. The spanning tree may determine the topology for the wiring of one or more given points in an electronic circuit design. For example, source A might route to sink B, and sink B might route to sink C. A, B, and C may all have physical locations, which may provide the wiring routes for the spanning tree. However, the spanning tree itself may not be a routed solution. The spanning tree may provide an initial starting point from which actual wires may be inserted.

In some embodiments, a spanning tree may be associated with a routing graph. A "routing graph" as used herein may include, but is not limited to, an intermediate data structure that may be used to evaluate a spanning tree, as will be described in greater detail below. In some embodiments, multiple spanning trees may exist for a single routing graph and may depict multiple, possible interconnection configurations between a plurality of nodes of a routed graph. Each of the routing graph and the spanning tree may be undirected and/or directed. Undirected may indicate that the relationship between one or more sinks and/or a source has no orientation. Directed may indicate that the relationship between one or more sinks and/or a source and a sink has an orientation.

A "source" as used herein may include, but is not limited to, a source node, source pin and/or a root. A "sink" as used herein may include, but is not limited to, a vertex, a terminal, a pin, and/or a node. An "edge" or "edge (a, b)" as used herein may include, but is not limited to, a feasible and/or potential link between two nodes (e.g., sink "a" and sink "b"). In some embodiments, an edge may be a tree edge and/or a non-tree edge. A "tree edge" as used herein may include, but is not limited to, an edge defined in a spanning tree. A "non-tree edge" as used herein may include, but is not limited to, an edge that is not defined in a spanning tree. In other words, a non-tree edge may be a possible link between one or more nodes of a routed graph but may not be defined in a spanning tree. A spanning tree may include one or more subtrees. A subtree as used herein may include, but is not limited to, a subset of one or more sinks downstream from a sink. A downstream sink may include, but is not limited to, a sink (e.g., a descendant sink) that is linked to an adjacent sink (e.g., an ancestor sink and/or upstream sink), such that the downstream sink may be further from the source than the adjacent sink and/or may be connected to the source through the adjacent sink. The cost of a spanning tree may include but is not limited to, the sum of the costs of each edge of the one or more edges 316 of the spanning tree. The cost of each edge may include, but is not limited to, the wirelength of each edge. A "wirelength" as used herein may include, but is not limited to, the distance between one or more sinks.

The distance between one or more sinks may include, but is not limited to, the Manhattan distance between the one or more sinks. A "radius" as used herein may include, but is not limited to, the distance between the source and the sink furthest from the source of a spanning tree.

As shown in the example of FIG. 3A, a spanning tree may include a source 308, one or more sinks 310A, 310B, 310C, 310D and one or more edges 312A, 312B, 312C, 312D to link the one or more sinks 310A, 310B, 310C, 310D and/or the source 308. The wirelength of edge 312A between the source 308 and sink 310A may be 8. The wirelength of edge 312B between sink 310A and sink 310B may be 5. The wirelength of edge 312C between the source 308 and sink 310C may be 4. The wirelength of edge 312D between sink 310A and sink 310D may be 3. As described above, the cost of each edge may be the wirelength and the cost of the spanning tree may be the cost of each edge of the spanning tree. In this example, the cost of spanning tree may be 20 (e.g., 8+5+4+3). The radius of the spanning tree may be the distance between the source 308 and the furthest sink. In this example, the radius may be the distance of edges 312A and 312B between the source 308 and sink 310B, which may be 13 (e.g., 8+5).

In another example and as shown in FIG. 3B, a spanning tree may include a source 308, one or more sinks 310A, 310B, 310C, 310D and one or more edges 312A, 312B, 312C, 312D to link the one or more sinks and/or the source 308. The wirelength of edge 312A between the source 308 and sink 310A may be 8. The wirelength of edge 312B between the source 308 and sink 310B may be 5. The wirelength of edge 312C between the source 308 and sink 310C may be 4. The wirelength of edge 312D between sink 310A and sink 310D may be 3. As described above, the cost of each edge may be the wirelength and the cost of the spanning tree may be the cost of each edge of the spanning tree. In this example, the cost of spanning tree may be 20 (e.g., 8+5+4+3). The radius of the spanning tree may be the distance between the source 308 and the furthest sink. In this example, the radius may be the distance of edges 312A and 312C between the source 308 and sink 310C, which may be 12 (e.g., 8+4).

In some embodiments, a spanning tree may be generated by an algorithm. Examples of algorithms that may generate spanning trees include, but are not limited to, Prim's algorithm, Dijkstra's algorithm, the Prim-Dijkstra algorithm, and other algorithms that may generate spanning trees within the scope of the present disclosure. Examples of spanning trees that may be received may include, but are not limited to, timing-driven and/or performance driven spanning trees, Steiner trees, rectilinear Steiner trees (RSTs), Rectilinear Steiner Minimum Trees (RSMTs), Minimum Rectilinear Steiner Arborescence (MRSA), Bounded Radius-Ratio Steiner Minimum Trees (BRSMTs), Critical-Sink Routing Trees (CSRTs), Elmore Routing Trees (ERTs), and any spanning tree within the scope of the present disclosure.

In some embodiments, spanning tree evaluation process 10 may receive a spanning tree $T=(V_T, E_T)$ and a routing graph $G=(V_G, E_G)$. In one example, the spanning tree and the routing graph may be directed (e.g., a directed spanning tree and/or a directed routing graph). In some embodiments, $V_T$ and $E_T$ may be vertices and edges in spanning tree T, respectively (i.e., V may be associated with vertices or sinks and E may be associated with edges). $V_G$ and $E_G$ may be vertices and edges in routing graph G, respectively. In some embodiments, the spanning tree $V_T$ may have some or all of the same vertices of the routing graph $V_G$, $(V_T=V_G)$. In some embodiments, the spanning tree $E_T$ may have some or all of the edges of the directed routing graph $E_G$, $(E_T \subset E_G)$. The vertices of the routing graph $V_G$ may include a source node s, $s \in V_G$. The routing graph may also include one or more sink nodes v, ($v \in V_G$ and $v \neq s$). For every sink node, there may exist a directed source-to-sink path (SSPath) in T. A spanning tree with a directed source-to-sink path for each sink node may be a source-to-sink tree.

In some embodiments, spanning tree evaluation process 10 may include receiving (204) a user-selected floating parameter. In some embodiments, the user-selected floating parameter ($\alpha$) may be a given weight value. For a given user-selected floating parameter, spanning tree evaluation process 10 may evaluate a received spanning tree for wasted wirelength and/or additional detour. In some embodiments, the user-selected floating parameter ($\alpha$) may be between 0 and 1. The total detour and total wirelength of the tree may be traded off by the user specified floating parameter $\alpha$ between 0 and 1. When $\alpha$ is 0, spanning tree evaluation process 10 may find a minimum spanning tree (MST). A minimum spanning tree, as used herein, may include but is not limited to a spanning tree with a minimum wirelength. When $\alpha$ is 1, spanning tree evaluation process 10 may find a shortest-path tree (SPT). An SPT as used herein may include, but is not limited to, a spanning tree with a minimum radius.

Figure 4:
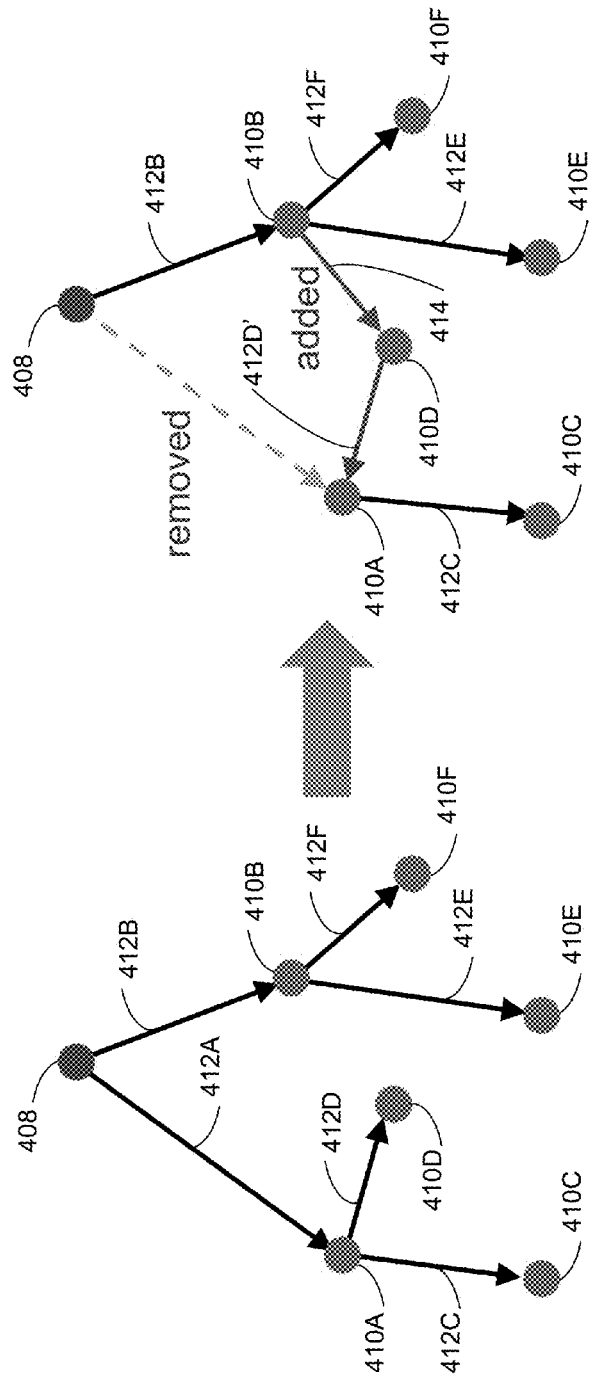
FIG. 4 is a schematic depicting aspects of the spanning tree evaluation process in accordance with an embodiment of the present disclosure.

A user and/or an EDA application may select the user-selected floating parameter based upon, at least in part, the tradeoff between increasing the wirelength in order to reduce source-sink distance and vice versa. The user-selected floating parameter may be stored as a default value, may be received from a graphical user interface, and/or may be received by any other suitable method from any source. For example, a user-selected floating parameter may be set to a default of 0. However, in some embodiments, if a signal net becomes critical, a user may increase the user-selected floating parameter until the signal net is no longer critical. Critical as used herein may include, but is not limited to, a signal net In some embodiments and as shown in FIG. 4, spanning tree evaluation process 10 may include interchanging (206) the one or more edges of the spanning tree based upon, at least in part, the user-selected floating parameter ($\alpha$). "Swapping" and "interchanging" as used herein, may include, but are not limited to, removing an edge, adding another edge and/or replacing an edge with another edge. In some embodiments, removing an edge may include removing a tree edge. In some embodiments, adding an edge may include adding a non-tree edge. In some embodiments, one or more edges of a spanning tree may be swapped until all pins and/or nodes connected. Spanning tree evaluation process 10 may iteratively remove one or more tree edges ($e \in E_T$) and/or add one or more non-tree edges ($e \in (E_G - E_T)$) to modify the received spanning tree and/or produce a new spanning tree which may result in a better wirelength-to-detour tradeoff according to a given weight value ($\alpha$). In some embodiments, spanning tree evaluation process 10 may iteratively swap or interchange one or more edges to reduce the spanning tree cost (e.g., wirelength). In some embodiments, spanning tree evaluation process 10 may swap or interchange one or more edges to reduce signal delay in the spanning tree (e.g., radius). In some embodiments, spanning tree evaluation process 10 may occur after a spanning tree has been created (e.g., spanning tree evaluation process 10 involve post-processing of the spanning tree). Spanning tree evaluation process 10 may evaluate a received spanning tree according to a cost function and may improve the wirelength and/or detour cost, as will be described in greater detail below.

In some embodiments, interchanging the one or more edges may include changing a direction of the one or more edges. During swapping, one or more edges may change direction. In one example, changing the direction of the one or more edges may be needed to maintain a source-to-sink tree structure. "Distance" of an edge swap as used herein may include, but is not limited to, a number of edges with direction changes during swapping.

In a non-limiting example and as shown in FIG. 4, one or more edges of a spanning tree may be interchanged. Spanning tree evaluation process 10 may interchange the edge 412A between the source 408 and sink 410A with the edge between sink 410B and sink 410D. In some embodiments, interchanging may include removing edge 412A and adding edge 414. In some embodiments, one or more of the edges of the spanning tree (e.g., a directed spanning tree) may be directed. In one example, 412D may be a directed edge. As shown in FIG. 4, interchanging one or more edges may change the direction of directed edge 412D (e.g., from sink 410A to 410D) to a directed edge 412D' (e.g., from 410D to 410A). The distance of the edge swap of FIG. 4 may be one because one edge (e.g., edge 412D) may have changed direction (e.g., 412D').

In some embodiments, interchanging the one or more edges may be further based upon, at least in part, at least one of: one or more wirelengths of the spanning tree, one or more detour costs associated with the one or more sinks of the spanning tree, and a number of downstream sinks associated with each sink of the one or more sinks of the spanning tree. In some embodiments, spanning tree evaluation process 10 may tradeoff between one or more of wirelength, radius, detour cost, and the number of downstream sinks. In some embodiments, interchanging the one or more edges may be further based upon, at least in part, wirelengths, detour costs, and the downstream number of sinks in accordance with a cost function which will be described in greater detail below. Detour cost, as used herein may include, but is not limited to, the cost of removing an existing edge and adding a new edge. The detour cost of an edge e ($v_i$, $v_j$) may be represented by Equation 1 below:

$$q_e = \text{dist}(s, v_i) + \text{len}(e) - \text{dist}(s, v_j) \tag{1}$$

where dist($s,v_i$) may be the distance between sources and sink $v_i$, len(e) may be an edge length and/or wirelength of edge e, and dist($s,v_j$) may be the distance between source s and sink $v_1$. In some embodiments, the detour cost of at a sink may include, but is not limited to, the sum of the detour costs of the edges from source to the sink. The detour cost of a sink may be represented by Equation 2 below.

$$Q_t = \Sigma e \epsilon_{SSPath_t} q_e \tag{2}$$

where $SSPath_t$ may include, but is not limited to, one or more edges of a path connecting the source and the sink t, and q e may be the detour cost of edge e.

In some embodiments, spanning tree evaluation process 10 may interchange one or more edges of the spanning tree based upon, at least in part, the cost function. Interchanging the one or more edges based upon, at least in part, the cost function may include, but is not limited to, reducing wire routing and/or improving the wirelength and detour cost simultaneously. Using the cost function may include considering wasted wirelength, detour cost and the downstream number of sinks. In some embodiments, spanning tree evaluation process 10 may swap one or more edges to directly optimize the wirelength/detour tradeoff to improve both criteria simultaneously.

In some embodiments, the cost function for swapping from an edge $e_{remove}$ to an edge $e_{add}$ may be represented by Equation 3 below:

$$\text{Cost} = \alpha \Sigma_{t \in V_T} \Delta Q_t + (1-\alpha)(\text{len}(e_{add}) - \text{len}(e_{remove})) \tag{3}$$

However, to calculate the total source to sink delay may be impractically time consuming. In some embodiments, when a sink's detour cost is changed by $\Delta Q_t$, every sink in the subtree under sink t may also be changed by $\Delta Q_t$. This may simplify calculations with the number of downstream sink(s) (K), as will be discussed in greater detail below.

Figure 5:
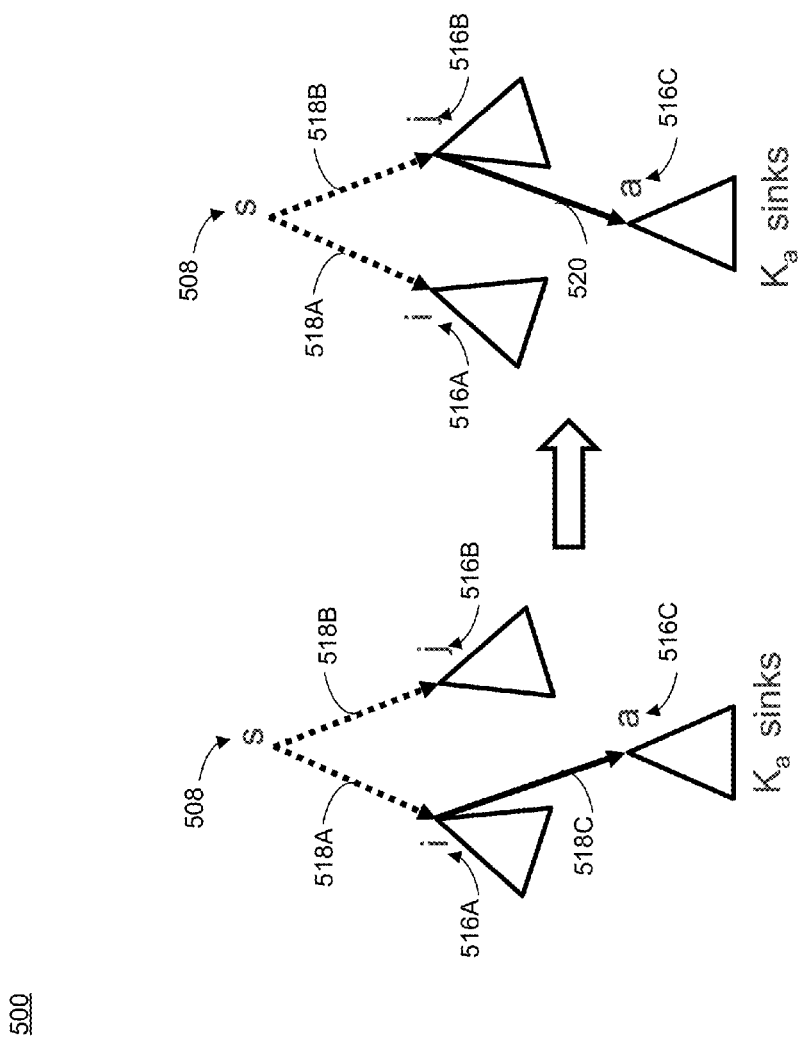
FIG. 5 is a schematic depicting aspects of the spanning tree evaluation process in accordance with an embodiment of the present disclosure.

In some embodiments and as shown in the example of FIG. 5, spanning tree evaluation process 10 may swap edge (i, a) with edge (j, a), where edge (i, a) may be $e_{remove}$ and edge (j, a) may be $e_{add}$. As shown in FIG. 5, the source s 508, may be linked to sink i 516A and sink j 516B by edge 518A and edge 518B, respectively. Sink i 516A may be linked to sink a 516C by edge 518C. In some embodiments, sinks a, i, and/or j may include subtrees. In one example, sink a may include $K_a$ sinks in a subtree, where $K_a$ may be a number of downstream sinks. Spanning tree evaluation process 10 may swap $e_{remove}$ to $e_{add}$ by removing edge (i, a) 518C and adding edge (j, a) 520. In this example, the distance for the edge swap may be zero because no edge directions may have been changed during the swap of $e_{remove}$ to $e_{add}$. The cost function for swapping from edge $e_{remove}$ to $e_{add}$ when edge swapping with a distance of zero (e.g., D=0) may be represented by Equation 4 below:

$$\text{Cost}_{D=0} = \alpha K_a (Q_j + q_{ja} - Q_a) + (1-\alpha)(\text{len}(e_{ja}) - \text{len}(e_{ia})) \tag{4}$$

Figure 6:
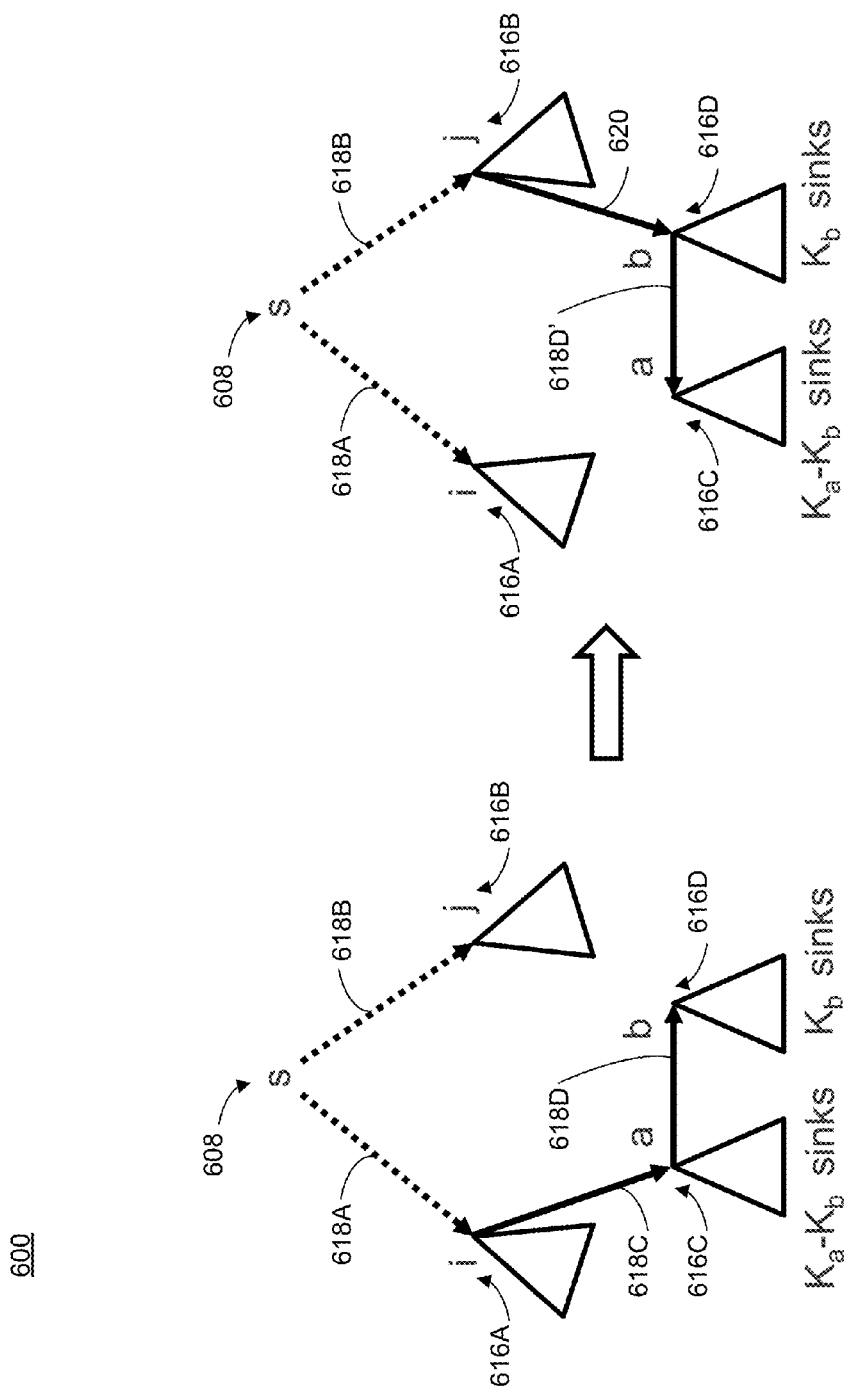
FIG. 6 is a schematic depicting aspects of the spanning tree evaluation process in accordance with an embodiment of the present disclosure.

In some embodiments and as shown in the example of FIG. 6, spanning tree evaluation process 10 may swap edge (i, a) with edge (j, b), where edge (i, a) may be $e_{remove}$ and edge (j, b) may be $e_{add}$. As shown in FIG. 6, the sources 608, may be linked to sink i 616A and sink j 616B by edge 618A and edge 618B, respectively. Sink i 616A may be linked to sink a 616C by edge 618C. Sink a 616C may be linked to sink b 616D by edge 618D. In some embodiments, sinks a, b, i, and/or j may include subtrees of downstream sinks. In one example, sink a 616C may include $K_a$ sinks in a subtree and sink b 616D may include $K_b$ sinks in a subtree. Spanning tree evaluation process 10 may swap $e_{remove}$ to $e_{add}$ by removing edge (i, a) 618C and adding edge (j, b) 620. In this example, the distance for the edge swap may be one because the edge direction for edge 618D may have been changed during the swap of $e_{remove}$ to $e_{add}$ to edge 618D' with a new direction. The cost function for swapping from edge $e_{remove}$ to $e_{add}$ when edge swapping with a distance of one (e.g., D=1) may be represented by Equation 5 below:

$$\text{Cost}_{D=1} = \alpha((K_a - K_b)(Q_j + q_{jb} + q_{ba} - Q_a) + K_b(Q_j + q_{jb} - Q_b)) + (1-\alpha)(\text{len}(e_{jb}) - \text{len}(e_{ia})) \tag{5}$$

Figure 7:
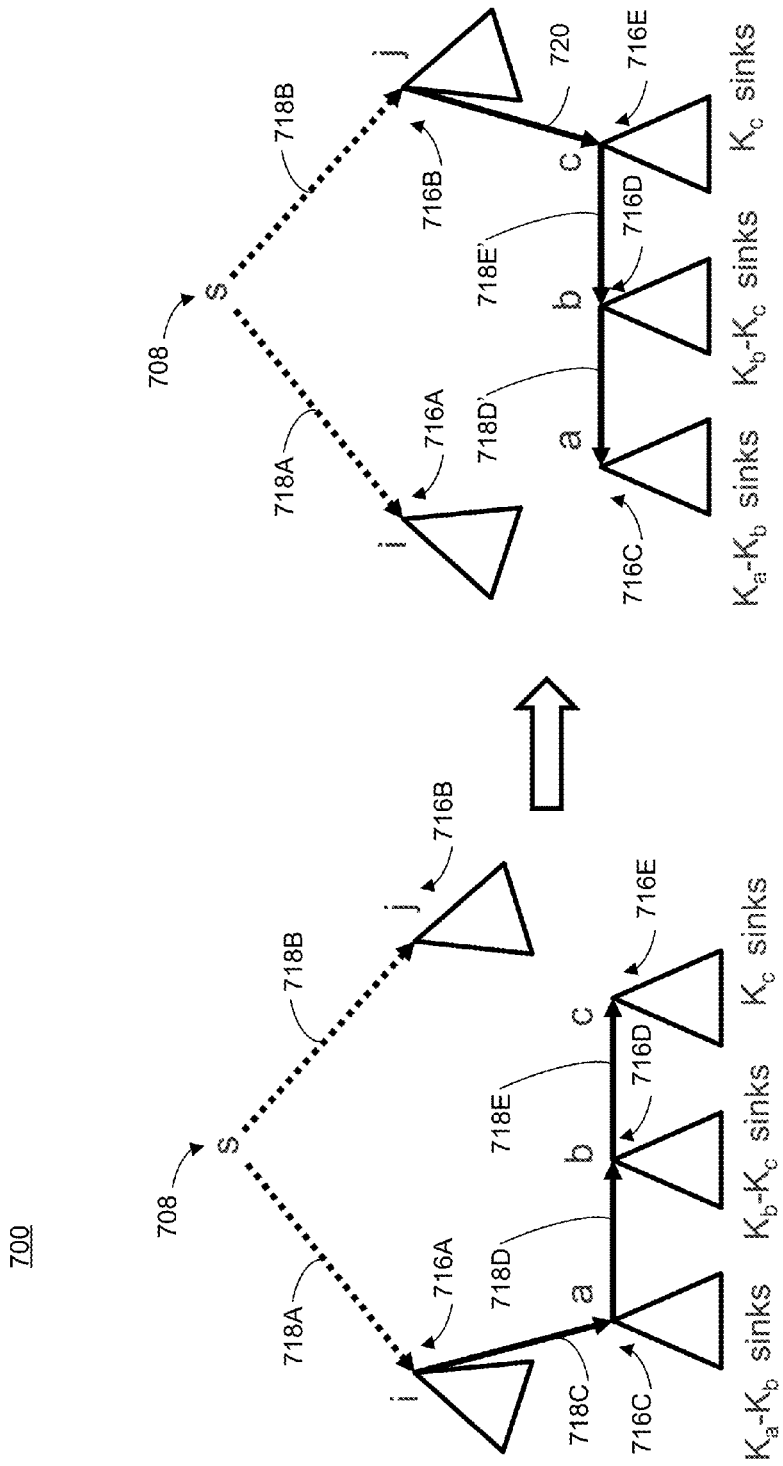
FIG. 7 is a schematic depicting aspects of the spanning tree evaluation process in accordance with an embodiment of the present disclosure.

In some embodiments and as shown in the example of FIG. 7, spanning tree evaluation process 10 may swap edge (i, a) with edge (j, c), where edge (i, a) may be $e_{remove}$ and edge (j, c) may be $e_{add}$. As shown in FIG. 7, the sources 708, may be linked to sink i 716A and sink j 716B by edge 718A and edge 718B, respectively. Sink i 716A may be linked to sink a 716C by edge 718C. Sink a 716C may be linked to sink b 716D by edge 718D. Sink b 716D may be linked to sink c 716E by edge 718E. In some embodiments, sinks a, b, c, i, and/or j may include subtrees of downstream sinks. In one example, sink a 716C may include $K_a$ sinks in a subtree, sink b 716D may include $K_b$ sinks in a subtree, and sink c 716E may include $K_c$ sinks in a subtree. Spanning tree evaluation process 10 may swap $e_{remove}$ and $e_{add}$ by removing edge (i, a) 718C and adding edge (j, c) 720. In this example, the distance for the edge swap may be two because the edge direction for edges 718D and 718E may have been changed during the swap of $e_{remove}$ to $e_{add}$ to edges 718D' and 718E' with new directions. The cost function for swapping from edge $e_{remove}$ to $e_{add}$ when edge swapping with a distance of two (e.g., D=2) may be represented by Equation 6 below:

$$\text{Cost}_{D=2} = \alpha((K_a - K_b)(Q_j + q_{jc} + a_{cb} - Q_a) + (K_b - K_c)(Q_j + q_{jc} + q_{cb} - Q_b) + K_c(Q_j + q_{jc} - Q_c)) + (1-\alpha)(\text{len}(e_{jc}) - \text{len}(e_{ia})) \quad (6)$$

While example distances of zero, one, and two have been described, any distance may be used within the scope of the present disclosure.

In some embodiments, spanning tree evaluation process 10 may determine that one or more edges $(v_i, v_j)$ and $(v_m, v_n)$ may be swapped when sink $v_n$ is a downstream sink of $v_j$. In other embodiments, spanning tree evaluation process 10 may determine that one or more edges $(v_i, v_j)$ and $(v_m, v_n)$ may be swapped when the number of edges in the path connecting sink $v_n$ and sink $v_j$ is at most D. Spanning tree evaluation process 10 may determine that one or more edges $(v_i, v_j)$ and $(v_m, v_n)$ may be swapped if sink $v_i$ is not an ancestor of sink $v_m$. In one example, spanning tree evaluation process 10 may determine that one or more edges $(v_i, v_j)$ and $(v_m, v_n)$ may be swapped when: $v_n$ is a downstream sink of $v_j$, when the number of edges in the path connecting $v_n$ and $v_j$ is at most D and if $v_i$ is not an ancestor of $v_m$.

Figure 8:
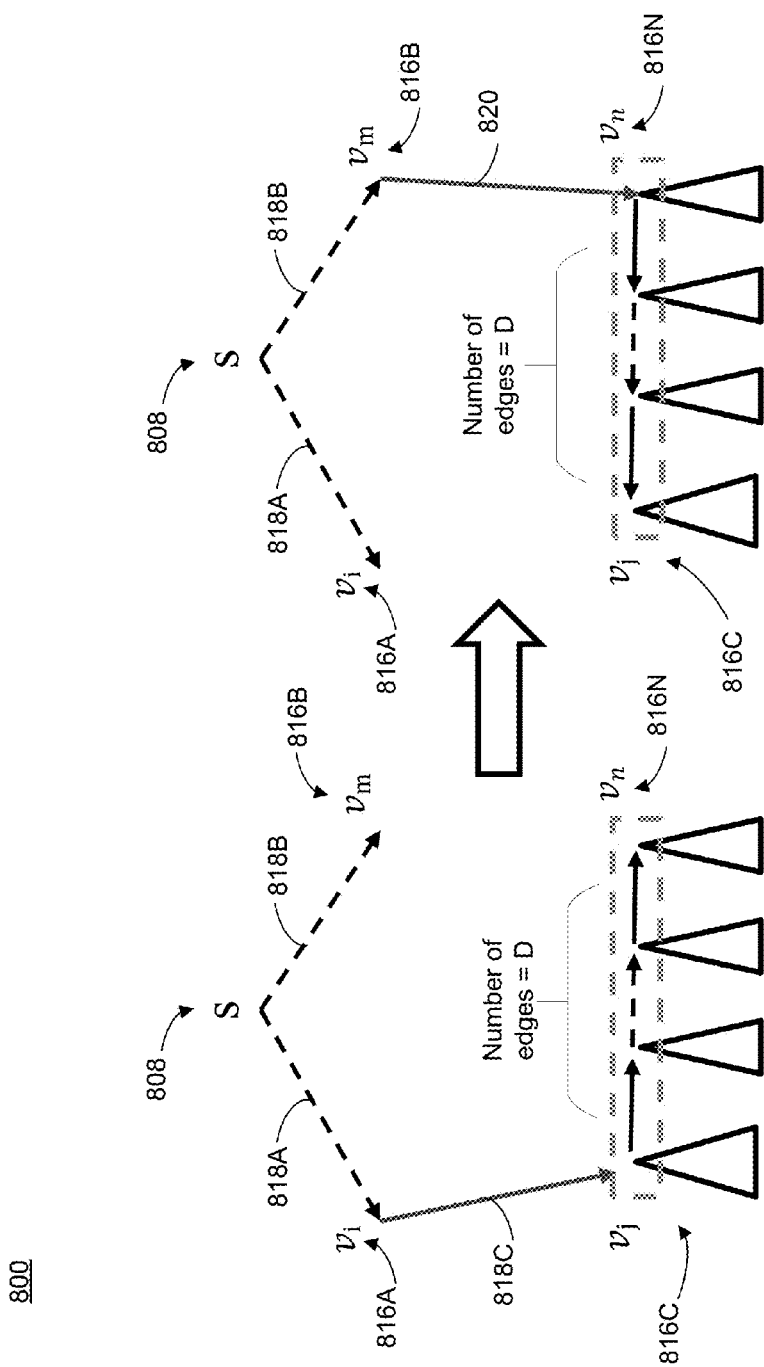
FIG. 8 is a schematic depicting aspects of the spanning tree evaluation process in accordance with an embodiment of the present disclosure.

In some embodiments and as shown in the example of FIG. 8, a spanning tree may include a source 808 and sinks $v_i$ 816A, $v_m$ 816B, $v_j$ 816C, and $v_n$ 816N. In some embodiments, sinks $v_j$ 816C, and $v_n$ 816N may be linked together directly and/or through one or more additional sinks (e.g., N sinks, where N may be the number of edges). In one example, $v_j$ 816C, and $v_n$ 816N may be separated by D edges. In some embodiments, sink $v_n$ 816B may be a downstream sink of $v_j$ 816C. In some embodiments, sink $v_i$ 816A may not be an ancestor of sink $v_m$ 816B. Spanning tree evaluation process 10 may determine that edges 818C and 818N may be swapped because of any or all of the following features: $v_j$ 816C, and $v_n$ 816N may be separated by D edges, sink $v_i$ 816A may not be an ancestor of sink $v_m$ 816B, and/or sink $v_n$ 816B may be a downstream sink of $v_j$ 816C.

Figure 9:
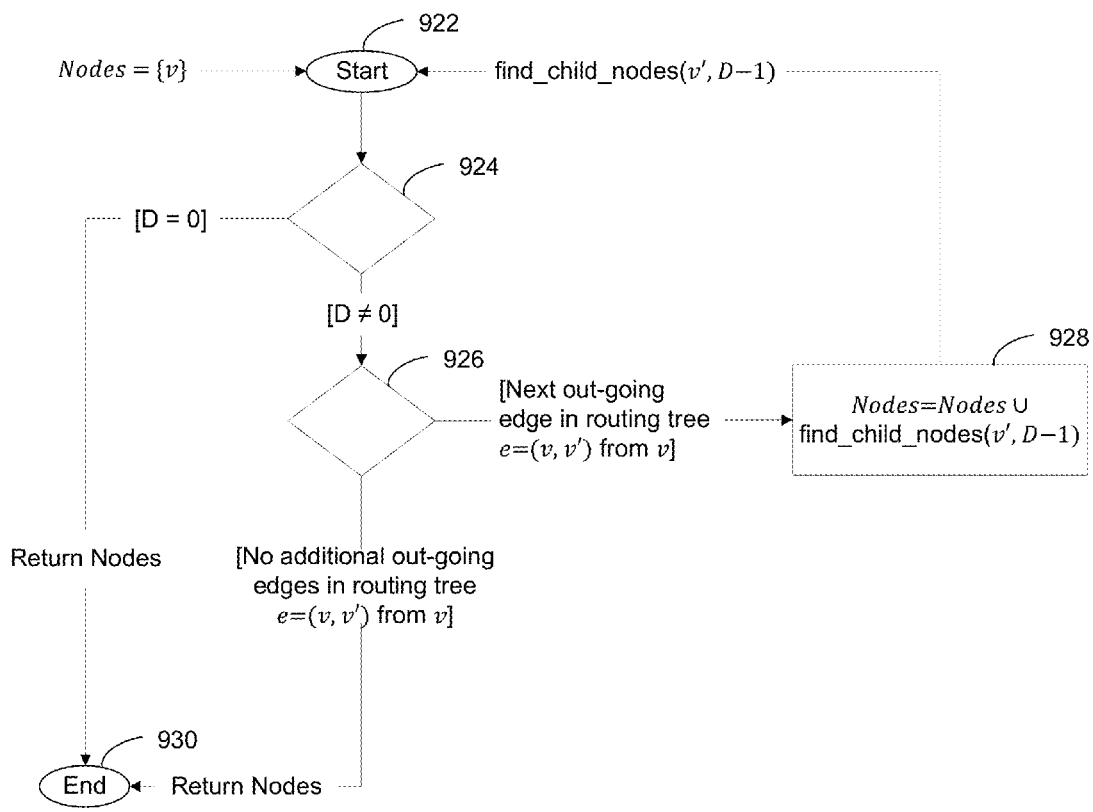
FIG. 9 is a flowchart depicting operations consistent with the spanning tree evaluation process of the present disclosure.

In some embodiments, and as shown in the example flowchart of FIG. 9, spanning tree evaluation process 10 may evaluate a spanning tree for eligible downstream sinks for swapping (e.g., child nodes) and may return one or more nodes. An example function 900 of spanning tree evaluation process 10 (e.g., find_child_nodes) may start 922 with a first sink v, and may determine 924 whether D=0. If D=0, function 900 may return a list of nodes, "Nodes". If D≠0, function 900 may determine 926 if there are any outgoing edges e=(v, v') in the spanning tree, T, from v. If spanning tree T includes one or more outgoing edges e=(v, v'), function 900 may identify a child node and add 928 the sink v' to "Nodes" and recursively call find_child_nodes for v' and D−1. Function 900 may recursively call find_child_nodes for each subsequent child node until there are no additional outgoing edges. If spanning tree T does not include any additional outgoing edges, function 900 may end 930 the function and return "Nodes".

The following is a non-limiting example of an implementation of one or more features and/or functions of spanning tree evaluation process 10 for finding one or eligible downstream sinks for swapping. Other implementations may be used within the scope of the present disclosure.

Figure 10:
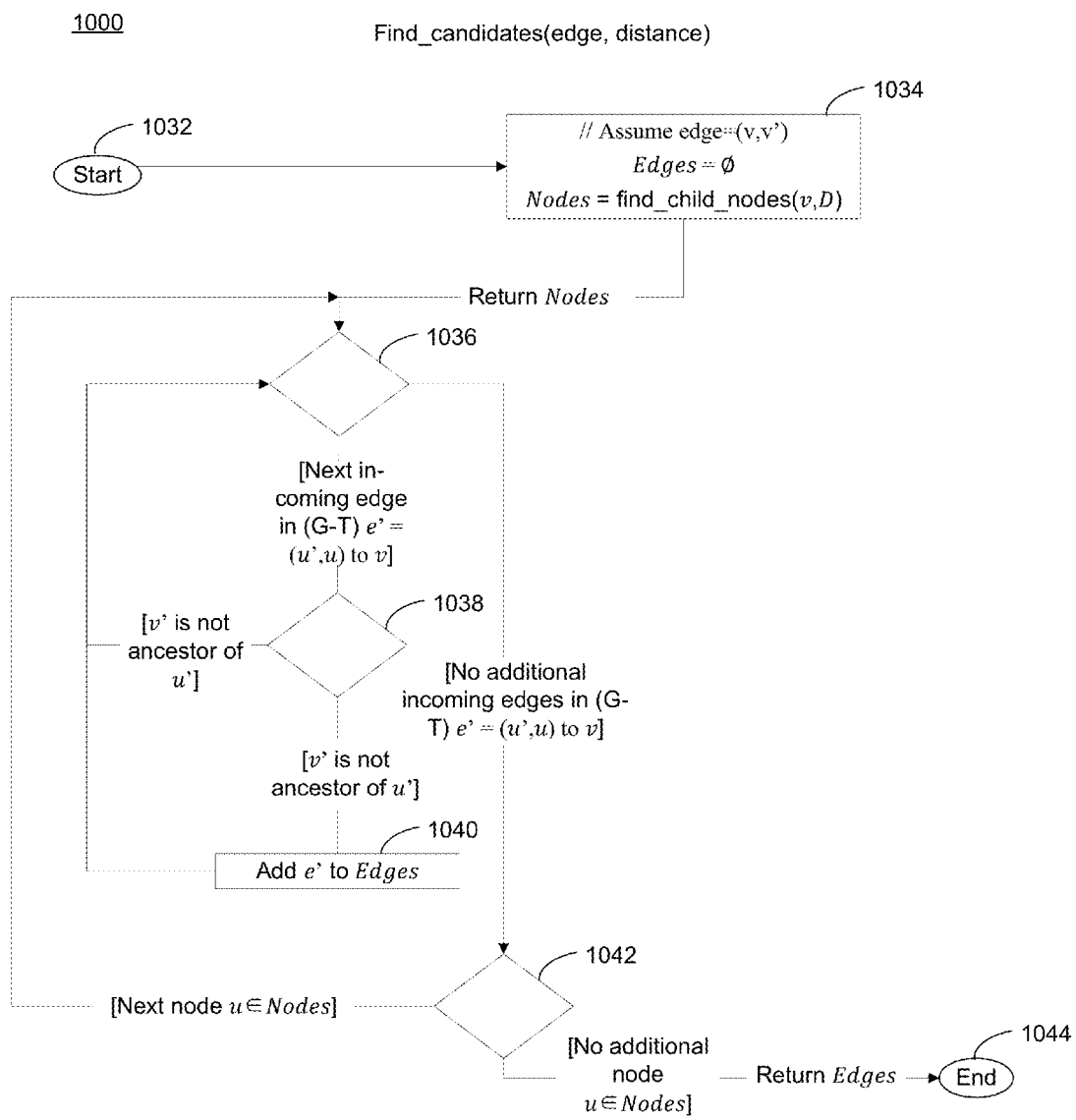
FIG. 10 is a flowchart depicting operations consistent with the spanning tree evaluation process of the present disclosure.

Function find_child_nodes (v, D)
    Nodes={v}
    If D=0
    return Nodes
    End If
    For each out-going edge in T e=(v, v') from v
    Nodes=Nodes∪find_child_nodes(v', D−1)
    End For
    return Nodes In some embodiments, and as shown in the example flowchart of FIG. 10, spanning tree evaluation process 10 may evaluate the spanning tree to find candidate edges for swapping. An example function 1000 of spanning tree evaluation process 10 (e.g., find_candidates) may start 1032 by assigning 1034 "Edges" to an empty set and "Nodes" to the result of function 900 (e.g., find_child_nodes) for inputs (v, D). In some embodiments, function 1000 may use the resulting "Nodes" from function 900 (e.g., find_child_nodes) to determine 1036 whether there are any incoming edges e'=(u',u) to u from node u'. If spanning tree T includes additional incoming edges e'=(u',u) to u from node u', spanning tree evaluation process 10 may determine 1038 whether v' is an ancestor of u' of the incoming edge e'=(u',u). If v' is not ancestor of u', spanning tree evaluation process 10 may add 1040 e' to "Edges". Spanning tree evaluation process 10 may determine if there are additional incoming edges e'=(u',u) to v and determine whether v' is an ancestor of u' until there are no additional incoming edges in the node. Spanning tree evaluation process 10 may determine 1042 whether there are additional nodes u∈"Nodes". If there are additional nodes, spanning tree evaluation process 10 may determine whether there are incoming edges in u and determine whether v' is an ancestor of u' of the incoming edge for each incoming edge of node u until there are no additional nodes. After determining that there are no additional nodes u∈"Nodes", spanning tree evaluation process 10 may end 1044.

The following is a non-limiting example of an implementation of one or more features and/or functions of spanning tree evaluation process 10. Other implementations may be used within the scope of the present disclosure.

Figure 11:
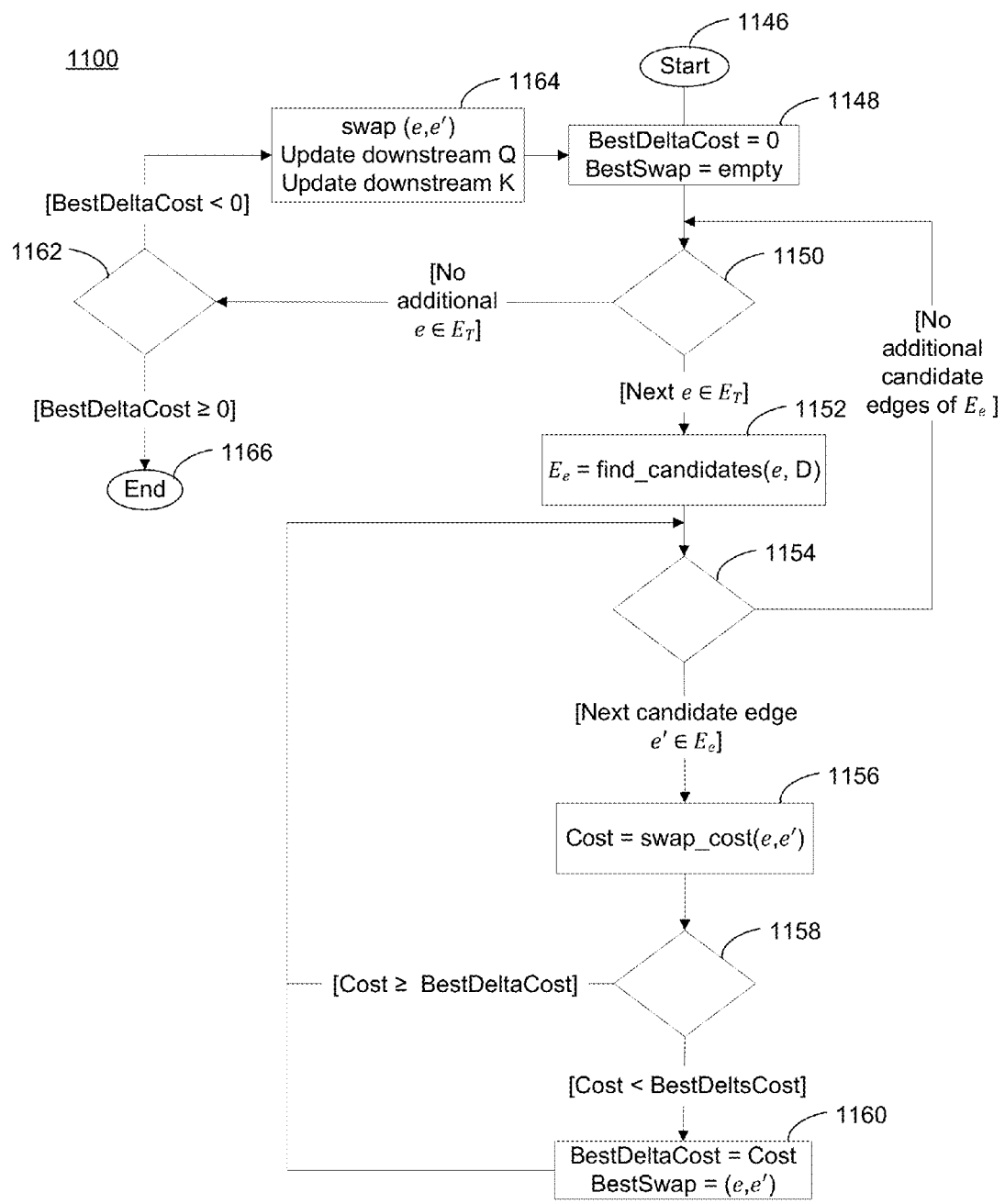
FIG. 11 is a flowchart depicting operations consistent with the spanning tree evaluation process of the present disclosure.

Function find_candidates(e, D)
    Assume e=(v, v')
    Edges=∅
    Nodes=find_child_nodes(v, D)
    For each u∈Nodes
    For each in-coming edge in (G−T) e'=(u',u) to u
        If v' is not ancestor of u'
            Add e' to Edges
        End If
    End For
    End For In some embodiments, and as shown in the example flowchart of FIG. 11, spanning tree evaluation process 10 may evaluate the spanning tree to determine which edges to interchange and interchange one or more edges. An example function 1100 of spanning tree evaluation process 10 may start 1146 by assigning 1148 "BestSwap" to an empty value and "BestDeltaCost" to zero. In some embodiments, function 1100 may determine 1150 whether there are any edges in the spanning tree e∈$E_T$. If spanning tree T includes edges e∈$E_T$, spanning tree evaluation process 10 may assign 1152 $E_e$ to the result of find_candidates(e, D). Function 1100 may determine 1154 whether there are any candidate edges e'∈Ee resulting from find_candidates(e, D). If candidate edges are found, function 1100 may assign 1156 Cost to the result of swap_cost(e, e'). In some embodiments, swap_cost(e, e') may represent the cost of swapping one or more edges (e, e'). In some embodiments, function 1100 may determine 1158 whether Cost is less than BestDeltaCost. If function 1100 determines that Cost is less than BestDeltaCost, BestDeltaCost may be assigned 1160 the value of Cost and BestSwap may be assigned edges (e, e'). Function 1100 may determine 1154 whether there are additional candidate edges e'∈Ee. If there are additional candidate edges, function 1100 may repeat the process as described above until there are no additional candidate edges e'∈Ee. After determining that there are no additional candidate edges e'∈Ee, function 1100 may determine 1150 whether there are any additional edges in the spanning tree e∈$E_T$. Function 1100 may repeat the process as described above until there are no additional edges in the spanning tree e∈$E_T$.

After determining that there are no additional edges e'∈Ee, function 1100 may determine 1162 whether BestDeltaCost is less than zero. In some embodiments, if BestDeltaCost is less than zero, function 1100 may have identified a swap that reduces the cost of the spanning tree and may perform 1164 one or more of swapping edges (e, e'), updating downstream Q, and/or updating upstream K, where Q may be the downstream sink detour costs and K may be the number of downstream sinks. In some embodiments, while function 1100 identifies moves that reduce the cost of the spanning tree, function 1100 may repeat the process as described above while BestDeltaCost is less than zero. When function 1100 determines 1162 that BestDeltaCost is greater than or equal to zero, function 1100 may end 1166. In one example, if the initial cost of the spanning tree is 20, function 1100 may find a swap with BestDeltaCost of −2. Function 1100 may do the swap and may make the new cost of the spanning tree equal to 18. If another iteration gives a BestDeltaCost of −1, then the new cost of the spanning tree may become 17. In some embodiments, function 1100 may not find an improving swap, which may mean that BestDeltaCost≥0 and function 1100 may end 1166.

The following is a non-limiting example of an implementation of one or more features and/or functions of spanning tree evaluation process 10. Other implementations may be used within the scope of the present disclosure.
Given a directed routing graph G=($V_G$, $E_G$)
Given a directed source-to-sink tree T=($V_G$, $E_T$)
Repeat:
  BestDeltaCost=0
  BestSwap=∅
  For each e∈$E_T$,
  $E_e$=find_candidates(e, D)
  For each candidate edge e'∈$E_e$
  Cost=swap_cost(e,e')
  If Cost<BestDeltaCost
    BestDeltaCost=Cost
    BestSwap=(e, e')
  End If
  End For
  If (BestDeltaCost<0)
  swap (e, e')
  Update downstream Q
  Update upstream K
  End If
While (BestDeltaCost<0)

Figure 12:
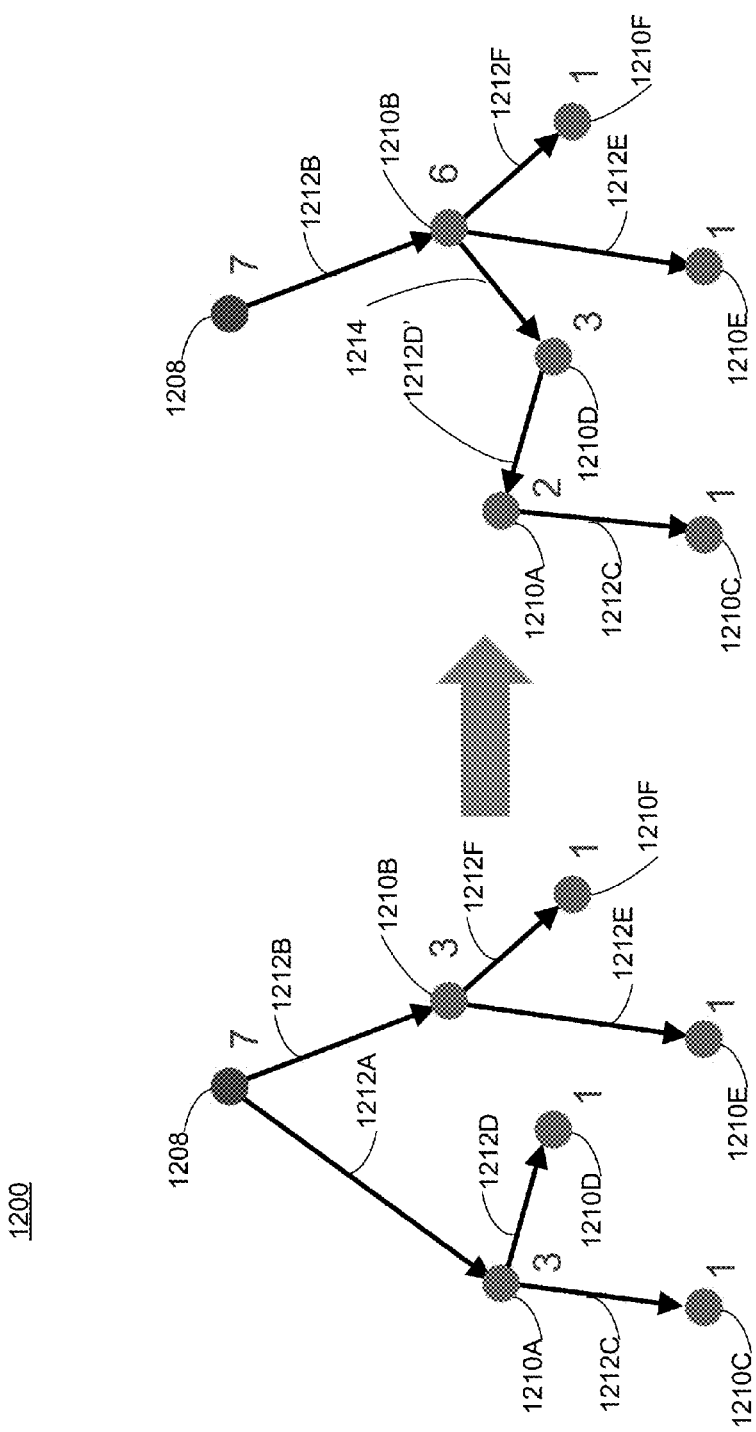
FIG. 12 is a schematic depicting aspects of the spanning tree evaluation process in accordance with an embodiment of the present disclosure.

In some embodiments, spanning tree evaluation process 10 may include determining the number of downstream sinks associated with each sink of the one or more sinks of the spanning tree. In some embodiments, spanning tree evaluation process may store the number of downstream sinks ($K_t$) at each sink t, as shown in FIG. 12. The number of downstream sinks may include the number of downstream and the current sink. For example, as shown in FIG. 12, spanning tree 1200 may include a source 1208 and sinks 1210A, 1210B, 1210C, 1210D, 1210E, 1210F. The number of downstream sinks for the source 1208 may be 7 which may be the number of all sinks downstream from the source (e.g., 6) and may also include the source (e.g., 1) to total 7. In some embodiments, the number of downstream sinks may be updated after each edge swapping.

In some embodiments and referring again to FIGS. 5-7, the number of downstream sinks, $K_t$ at each sink t, may be updated upstream as shown below in Equations 7-8 for a distance of zero (e.g., D=0):

$$K_i'=K_i-K_a \tag{7}$$

$$K_j'=K_j+K_a \tag{8}$$

In some embodiments, the number of downstream sinks, $K_t$ at each sink t, may be updated upstream as shown below in Equations 9-12 for a distance of one (e.g., D=1):

$$K_i'=K_i-K_a \tag{9}$$

$$K_j'=K_j+K_a \tag{10}$$

$$K_a'=K_a-K_b \tag{11}$$

$$K_b'=K_a \tag{12}$$

In some embodiments, the number of downstream sinks, $K_t$ at each sink t, may be updated upstream as shown below in Equations 13-17 for a distance of two (e.g., D=2):

$$K_i'=K_i-K_a \tag{13}$$

$$K_j'=K_j+K_a \tag{14}$$

$$K_a'=K_a-K_b \tag{15}$$

$$K_b'=K_a-K_c \tag{16}$$

$$K_c'=K_a \tag{17}$$

While example distances of zero, one, and two have been described, any distance may be used within the scope of the present disclosure. In some embodiments, parent nodes of sinks i and j may be updated with the same K change ($K_i'-K_i$ and $K_j'-K_j$) until the nearest common ancestor of i and j.

Spanning tree evaluation process 10 may also include updating each sink of the one or more sinks with a common detour cost change after interchanging one or more edges. As discussed above, to calculate the total source to sink delay of a spanning tree for each detour may be impractically time consuming. In some embodiments, when a sink's detour cost is changed by $\Delta Q_t$, every sink in the subtree under sink t may also be changed by $\Delta Q_t$. This may simplify calculations with the number of downstream sink(s) (K). In some embodiments, whenever a sink's detour cost is changed, spanning tree evaluation process 10 may update all downstream sinks' detour cost with the same change, or a common detour cost change, $\Delta Q_t$.

In some embodiments, interchanging the one or more edges may include selecting an edge of the one or more edges that is shared by a plurality of source-to-sink paths. In some embodiments, spanning tree evaluation process 10 may choose an edge that may be shared by more source-to-sink paths, based upon, at least in part, the number of downstream sinks (K), even if the edge is relatively long. This may result in a lower detour cost with a lower total wirelength. Other processes, such as PD, pick relatively short edges that result in higher detour costs and/or higher total wirelength.

In some embodiments utilizing the spanning tree evaluation process 10 for reducing wire routing in an integrated circuit, a 20% better detour cost for the same wirelength and/or capacitance may be observed. In the context of integrated circuits, this may help delays for critical nets. It may also create better buffer trees and better clock networks. Overall, the physical design of integrated circuits may improve with utilization of spanning tree evaluation process 10.

In some embodiments of the present disclosure, spanning tree evaluation process 10 may reduce wirelength and/or the radius of a spanning tree. In one example, reducing the wirelength and/or the radius of a spanning tree in the context of integrated circuit design may reduce signal delays and capacitance in an integrated circuit.

Spanning tree evaluation process 10 may be configured to operate with various EDA applications such as those available from the Assignee of the present disclosure, which may allow the user to evaluate a spanning tree associated with an integrated circuit design. In some embodiments, spanning tree evaluation process 10, when configured to operate with EDA application 20, may evaluate a spanning tree associated with an integrated circuit design, reduce wirelengths, and increase data throughput for the integrated circuit design. In some embodiments, the spanning tree may be received at a graphical user interface associated with the EDA application 20. In some embodiments, the user-selected floating parameter may be received at a graphical user interface associated with EDA application 20.

In some embodiments, EDA application 20 may support a variety of languages and/or standards. Some of these may include, but are not limited to, IEEE-standard languages, the Open Verification Methodology (OVM), the emerging Accellera Universal Verification Methodology (UVM), and the e Reuse Methodology (eRM). EDA application 20 may support e, Open Verification Library (OVL), OVM class library, emerging UVM class library, SystemC®, SystemC Verification Library, SystemVerilog, Verilog®, VHDL, PSL, SVA, CPF, as well as numerous other languages. EDA application 20 may be used in accordance with mixed-language, mixed-signal, and low-power designs, across multiple levels of abstraction, and may include the ability to "hot swap" the RTL simulation in/out of numerous accelerators/emulators.

As used in any embodiment described herein, the terms "circuit" and "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof. Embodiments of the present disclosure may be incorporated in whole or in part into any design tools.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for evaluating a spanning tree and reducing wirelength associated with an integrated circuit design comprising:
   receiving, using at least one processor, a spanning tree associated with an integrated circuit design to be fabricated including one or more sinks coupled by one or more edges;
   receiving a user-selected floating parameter; and
   interchanging the one or more edges of the spanning tree based upon, at least in part, the user-selected floating parameter, one or more wirelengths of the spanning tree, one or more detour costs associated with the one or more sinks of the spanning tree, and a number of downstream sinks associated with each sink of the one or more sinks of the spanning tree, wherein interchanging results in reducing one or more wirelengths of the spanning tree resulting in a reduced wirelength integrated circuit, wherein interchanging includes replacing a first edge with a second edge.

2. The computer-implemented method of claim 1, wherein interchanging the one or more edges includes removing a tree edge and adding a non-tree edge.

3. The computer-implemented method of claim 1, wherein interchanging the one or more edges includes changing a direction of the one or more edges.

4. The computer-implemented method of claim 1, further comprising:
   determining the number of downstream sinks associated with each sink of the one or more sinks of the spanning tree.

5. The computer-implemented method of claim 1, further comprising:
   updating each sink of the one or more sinks with a common detour cost change after interchanging one or more edges.

6. The computer-implemented method of claim 1, wherein interchanging the one or more edges includes selecting an edge of the one or more edges that is shared by a plurality of source-to-sink paths.

7. A computer-readable storage medium having stored thereon instructions that when executed by a machine result in the following operations:
   receiving a spanning tree associated with an integrated circuit design to be fabricated including one or more sinks coupled by one or more edges;
   receiving a user-selected floating parameter; and
   interchanging the one or more edges of the spanning tree based upon, at least in part, the user-selected floating parameter, one or more wirelengths of the routing tree and one or more detour costs associated with the one or more sinks of the routing tree, wherein interchanging results in reducing one or more wirelengths of the routing tree resulting in a reduced wirelength integrated circuit, wherein interchanging includes replacing a first edge with a second edge.

8. The computer-readable storage medium of claim 7, wherein interchanging the one or more edges includes removing a tree edge and adding a non-tree edge.

9. The computer-readable storage medium of claim 7, wherein interchanging the one or more edges includes changing a direction of the one or more edges.

10. The computer-readable storage medium of claim 7, further comprising:
    determining the number of downstream sinks associated with each sink of the one or more sinks of the spanning tree.

11. The computer-readable storage medium of claim 7, further comprising:
    updating each sink of the one or more sinks with a common detour cost change after interchanging one or more edges.

12. The computer-readable storage medium of claim 7, wherein interchanging the one or more edges includes selecting an edge of the one or more edges that is shared by a plurality of source-to-sink paths.

13. A system for evaluating a spanning tree comprising:
    a computing device having at least one processor configured to receive a spanning tree associated with an integrated circuit design to be fabricated including one or more sinks coupled by one or more edges, the at least one processor further configured to receive a user-selected floating parameter and swap the one or more edges of the spanning tree based upon, at least in part, the user-selected floating parameter, one or more wirelengths of the routing tree, one or more detour costs associated with the one or more sinks of the routing tree, and a number of downstream sinks associated with each sink of the one or more sinks of the routing tree, wherein swapping the one or more edges includes replacing a first edge with a second edge.

14. The system of claim 13, wherein swapping the one or more edges includes removing a tree edge and adding a non-tree edge.

15. The system of claim 13, wherein swapping the one or more edges includes changing a direction of the one or more edges.

* * * * *